(12) United States Patent
Kazama

(10) Patent No.: US 10,101,946 B2
(45) Date of Patent: Oct. 16, 2018

(54) METHOD OF READING DATA FROM A MEMORY DEVICE AND INFORMATION PROCESSING SYSTEM CONTROLLING DATA READING

(71) Applicant: FUJITSU LIMITED, Kawasaki-shi, Kanagawa (JP)

(72) Inventor: Satoshi Kazama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/202,695

(22) Filed: Jul. 6, 2016

(65) Prior Publication Data

US 2017/0024165 A1    Jan. 26, 2017

(30) Foreign Application Priority Data

Jul. 24, 2015   (JP) .................................. 2015-147261

(51) Int. Cl.
  *G11C 16/26*   (2006.01)
  *G06F 3/06*   (2006.01)

(52) U.S. Cl.
  CPC .......... *G06F 3/0659* (2013.01); *G06F 3/0611* (2013.01); *G06F 3/0679* (2013.01); *G11C 16/26* (2013.01)

(58) Field of Classification Search
  CPC ..... G11C 16/26; G06F 3/0659; G06F 3/0611; G06F 3/0679
  See application file for complete search history.

(56) References Cited

U.S. PATENT DOCUMENTS

| | | | |
|---|---|---|---|
| 6,409,624 B1 | 6/2002 | Sano | |
| 6,499,090 B1* | 12/2002 | Hill | ..................... G06F 13/1642 710/309 |
| 2005/0172110 A1* | 8/2005 | Hirotsu | ............... G06F 9/30054 712/244 |
| 2007/0005905 A1 | 1/2007 | Yasue et al. | |
| 2009/0089492 A1* | 4/2009 | Yoon | ................... G06F 13/1689 711/103 |
| 2010/0100670 A1* | 4/2010 | Jeddeloh | ............. G06F 13/1626 711/105 |

(Continued)

FOREIGN PATENT DOCUMENTS

| | | |
|---|---|---|
| JP | 2001-12589 | 1/2001 |
| JP | 2006-260067 | 9/2006 |
| JP | 2010-191983 | 9/2010 |

*Primary Examiner* — Khamdan Alrobaie
(74) *Attorney, Agent, or Firm* — Oblon, McClelland, Maier & Neustadt, L.L.P.

(57) ABSTRACT

A method of reading data from a first memory device includes generating a first read command based on a first request which requests to generate the first read command for first data stored in a first address region of the first memory device, generating a second read command for second data stored in a second address region of the first memory device, generating a third read command based on a second request which requests to generate the third read command for third data stored in a third address region of the first memory device, executing the first read command and the third read command to read the first data and the third data, respectively, from the first memory device, and after the executing the first read command and the third read command, executing the second read command to read the second data from the first memory device.

15 Claims, 17 Drawing Sheets

(56) References Cited

U.S. PATENT DOCUMENTS

2010/0262721 A1* 10/2010 Asnaashari ........... G06F 13/161
  710/5
2014/0379963 A1* 12/2014 Kazama ................ G06F 3/0611
  711/103
2015/0074337 A1*  3/2015 Jo ....................... G06F 12/0246
  711/103
2015/0347027 A1* 12/2015 Lu ........................ G06F 3/0611
  711/103

* cited by examiner

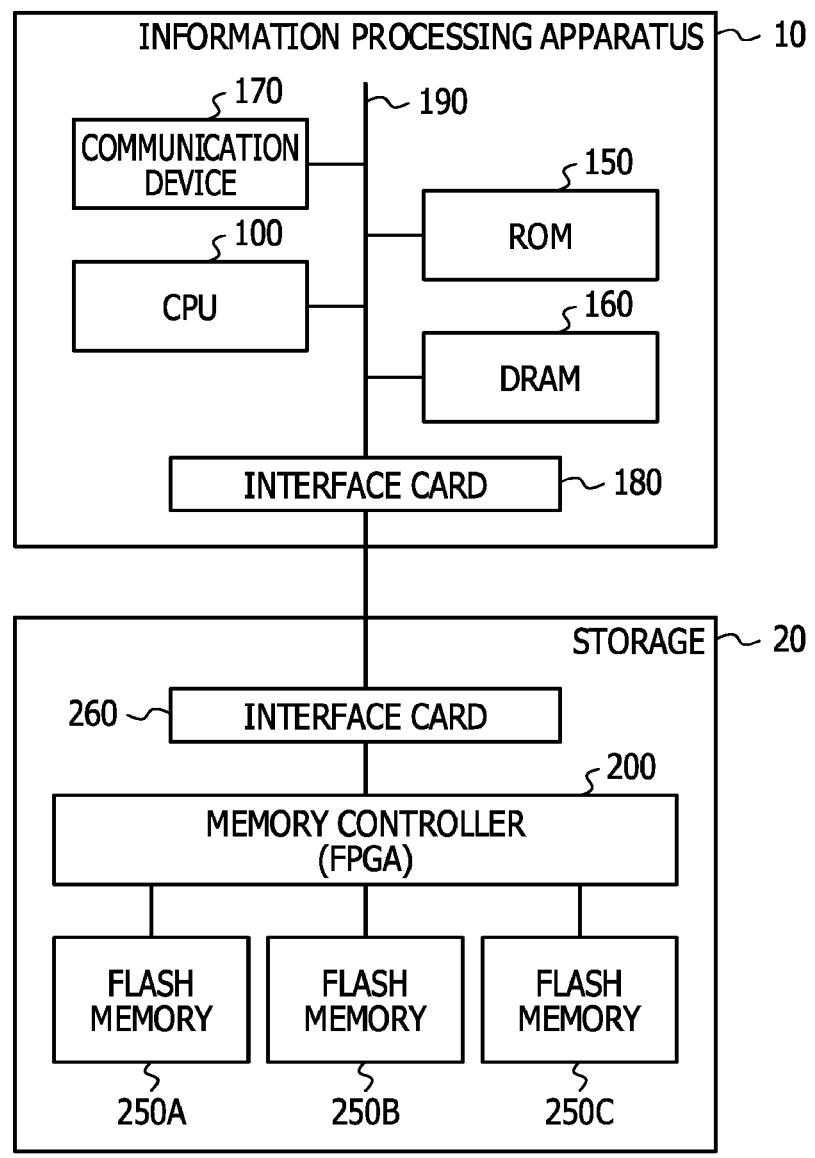

FIG. 6A

| COMMAND ID | LOGICAL ADDRESS | DRAM ADDRESS | COMPLETION FLAG |
|---|---|---|---|
| A | a | x | – |
| B | b | y | – |
| ⋮ | ⋮ | ⋮ | ⋮ |

FIG. 6B

| COMMAND ID | LOGICAL ADDRESS | DRAM ADDRESS | COMPLETION FLAG |
|---|---|---|---|
| A | a | x | 1 |
| B | b | y | 1 |
| ⋮ | ⋮ | ⋮ | ⋮ |

FIG. 13A

| LOGICAL ADDRESS | WRITE TIME | DETERMINATION FLAG |
|---|---|---|
| a | 9:13:21.37 | – |
| b | 9:13:21.89 | – |
| c | 9:13:22.15 | – |
| ⋮ | ⋮ | ⋮ |

FIG. 13B

| LOGICAL ADDRESS | WRITE TIME | DETERMINATION FLAG |
|---|---|---|
| a | 9:13:21.37 | 1 |
| c | 9:13:22.15 | – |
| ⋮ | ⋮ | ⋮ |

METHOD OF READING DATA FROM A MEMORY DEVICE AND INFORMATION PROCESSING SYSTEM CONTROLLING DATA READING

CROSS-REFERENCE TO RELATED APPLICATION

This application is based upon and claims the benefit of priority of the prior Japanese Patent Application No. 2015-147261, filed on Jul. 24, 2015, the entire contents of which are incorporated herein by reference.

FIELD

The embodiments discussed herein are related to a method and an information processing system.

BACKGROUND

It is desirable that, when an information processing apparatus, such as a server, accesses an external storage device such as storage and reads data stored on the external storage device, the time taken to read data be reduced. Nonvolatile memory, such as a hard disk drive (HDD) or flash memory, is provided in the storage, and data is stored in the nonvolatile memory. The time taken to read data from nonvolatile memory is typically longer than that from volatile memory, such as dynamic random access memory (DRAM) or static random access memory (SRAM). For example, in negative-AND (NAND) flash memory, data is read on a per-page basis, and the time taken is, for example, about 50 µs to read data of one page.

As a way to reduce the time taken to read data from nonvolatile memory, a process called data prefetching or speculative reading of data is known. This data prefetching process is a way by which, for example, when a server reads some data from nonvolatile memory, the server also reads data predicted to be likely to be used later for operations and the like in the server and holds the data in volatile memory provided in the server. When data is held in advance in volatile memory through the data prefetching process, the server may use the data held in the volatile memory without reading data into nonvolatile memory, enabling the speed-up of operations to be attained. In specific processing of the data prefetching process, when a data read command that specifies a first address of nonvolatile memory is issued from a server, the server identifies a second address at which the data prefetching process is to be performed. A normal data read command with the first address at which data is to be read and a data prefetch command with the second address at which data is to be read are issued from the server to the storage. The storage executes the normal data read command and the data prefetch command and sends data read from the nonvolatile memory to the server.

In the data prefetching process, an algorithm called Look Ahead, for example, is known as a way to identify an address at which prefetching is to be performed. Look Ahead is a way to identify an address next to an address specified by a normal data read command, as an address at which the data prefetching process is to be performed.

As examples of related art techniques, Japanese Laid-open Patent Publication No. 2001-12589, Japanese Laid-open Patent Publication No. 2006-260067, and Japanese Laid-open Patent Publication No. 2010-191983 are known.

SUMMARY

According to an aspect of the invention, a method of reading data from a first memory device includes generating a first read command based on a first request which requests to generate the first read command for first data stored in a first address region of the first memory device, generating a second read command for second data stored in a second address region different from the first address region of the first memory device, after the generating the second read command, generating a third read command based on a second request which requests to generate the third read command for third data stored in a third address region of the first memory device, executing the first read command and the third read command to read the first data and the third data, respectively, from the first memory device, and after the executing the first read command and the third read command, executing the second read command to read the second data from the first memory device.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 illustrates an example of a hardware configuration of a system in the first embodiment;

FIGS. 6A and 6B depict examples of content of a held data table in the first embodiment;

FIGS. 13A and 13B depict examples of content of a prefetch list table in the second embodiment;

DESCRIPTION OF EMBODIMENTS

When a data prefetching process is performed, a normal data read command for reading data that will be actually used by a server and a data prefetch command for reading data that is predicted to be used by the server are issued. An object of the present disclosure is to reduce the delay in the execution of a normal data read command caused by the execution of a data prefetch command.

First Embodiment

Figure 1:
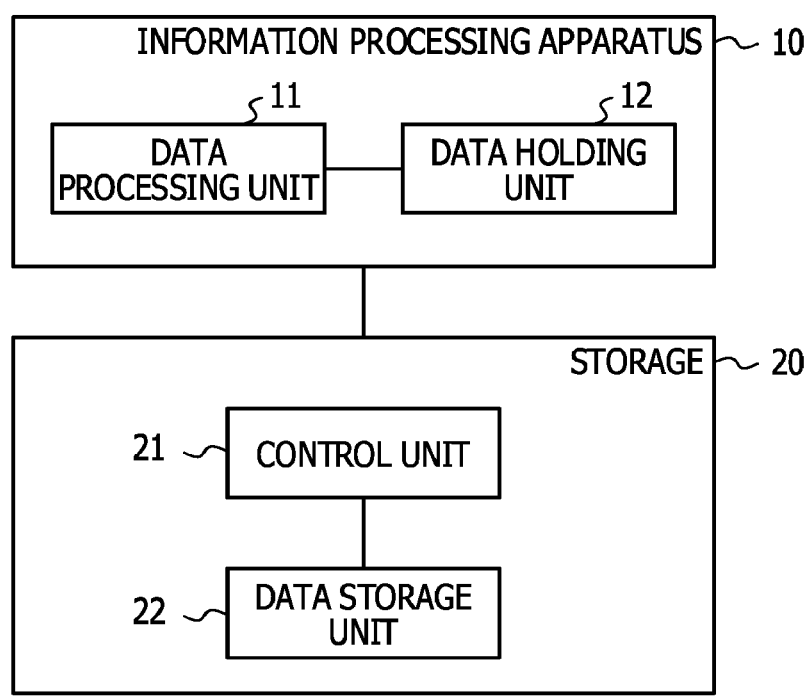
FIG. 1 illustrates a system configuration in a first embodiment.

FIG. 1 illustrates a configuration of a system in a first embodiment. The system disclosed in the present embodiment includes an information processing apparatus 10 and a storage 20. As the information processing apparatus 10, a host device, such as a server, as well as a terminal device, such as a personal computer (PC), is applicable. As the storage 20, a solid state drive (SSD) or an HDD is applicable. The information processing apparatus 10 includes a data processing unit 11 that performs data processing, and a data holding unit 12 that holds data for use for data processing in the data processing unit 11 or data processed in the data processing unit 11. The storage 20 includes a data storage unit 22 that stores data, and a control unit 21 that controls processing of storing data in the data storage unit 22 and processing of reading data from the data storage unit 22.

FIG. 2 illustrates an example of a hardware configuration of the system in the first embodiment. The information processing apparatus 10 includes a central processing unit (CPU) 100, a read-only memory (ROM) 150, a DRAM 160, a communication device 170, an interface card 180, and a bus 190. The CPU 100 downloads a computer program stored in the ROM 150 to the DRAM 160 and executes it, thereby performing given data processing. The CPU 100 is an example of a processor chip, and a micro control unit (MCU), a micro processing unit (MPU), a digital signal processor (DSP), a field programmable gate array (FPGA), or the like may be used in place of the CPU 100.

Computer programs and so on executed by the CPU 100 are stored in the ROM 150. The ROM 150 is an example of nonvolatile memory, and mask read-only memory (mask ROM), programmable read-only memory (PROM), flash memory, magnetoresistive random access memory (MRAM), Resistance Random Access Memory (RRAM) (registered trademark), ferroelectric random access memory (FeRAM), or the like is applicable.

A computer program stored in the ROM 150 is downloaded to the DRAM 160. The DRAM 160 receives data to be processed by the CPU 100 from the storage 20 and holds the data. The DRAM 160 is an example of volatile memory, and an SRAM may be used in place of the DRAM 160. The communication device 170, which is a device used when the information processing apparatus 10 performs data communication with another information processing apparatus, may include a wireless communication device or a wired communication device. The bus 190 couples the CPU 100, the ROM 150, the DRAM 160, and the communication device 170 to one another and functions as a path for data communication among them. The interface card 180 is coupled by the bus 190 to the CPU 100 and the DRAM 160. The interface card 180 transmits a command, such as a data read command (read command) or a data write command (program command), to the storage 20 and receives data read from the storage 20.

The storage 20, the other component of the system, includes a memory controller 200, flash memory 250A, 250B and 250C, and an interface card 260. The memory controller 200 is, for example, an FPGA chip. The memory controller 200 may be implemented using a CPU or an MCU other than an FPGA. The flash memory 250A, 250B, and 250C is an example of nonvolatile memory for storing data and is, for example, NAND flash memory. Other than NAND flash memory, however, NOR flash memory, mask ROM, PROM, MRAM, RRAM, FeRAM, or the like is applicable as nonvolatile memory. The flash memory 250A, 250B, and 250C composed of three chips is illustrated in FIG. 2; however, this is an example of a hardware configuration of nonvolatile memory and is not intended to limit the number of chips of nonvolatile memory. In the present embodiment, the number of chips of nonvolatile memory is called a "channel", and the flash memory 250A, the flash memory 250B, and the flash memory 250C correspond to a first channel, a second channel, and a third channel, respectively. Hereinafter, when there is no intention to specify any of the three pieces of flash memory illustrated in the drawing, each piece of the flash memory is denoted simply as "flash memory 250". In the flash memory 250 of each channel, memory cells of 2112 bytes, for example, constitute one page. Additionally, one block is composed of 64 pages, for example. For the NAND flash memory, data erasing is performed on a per-block basis, and data reading and data writing are performed on a per-page basis.

The interface card 260 receives a command transmitted from the information processing apparatus 10. Based on the command received by the interface card 260, the memory controller 200 performs processing, such as data reading, data writing, and data erasing, on the flash memory 250. The memory controller 200 transmits data read from the flash memory 250 through the interface card 260 to the information processing apparatus 10.

Here, the processing procedure of a data prefetching process will be described. If data for use when the CPU 100 executes data processing is not held in the DRAM 160, the CPU 100 reads the data concerned from the storage 20 and causes the DRAM 160 to hold it. At that point, the CPU 100 issues a data read command that specifies an address of the flash memory 250 at which the data concerned is stored (hereinafter called a "data normal-read command"). Other than the data normal-read command, the CPU 100 also issues an additional data read command for speculatively reading data predicted to be used for data processing on the CPU 100 (hereinafter called a "data prefetch command"). The number of data prefetch commands issued for one data normal-read command may be one or may be two or more. Hereinafter, the expression "data read command" is used as a superordinate concept containing both "data normal-read command" and "data prefetch command". The expression "command" is used as a higher superordinate concept containing a data read command and, other than this, a data write command (program command), a data erasing command (erase command), and so on.

The data normal-read command and the data prefetch command issued by the CPU 100 are transmitted through the interface card 180 of the information processing apparatus 10 and the interface card 260 of the storage 20 to the memory controller 200. The memory controller 200 reads data stored at an address specified by the data normal-read command from the flash memory 250. For example, in a NAND flash memory, data reading is performed on a per-page basis. The time taken is, for example, about 50 μs to read data of one page. Therefore, when the memory controller 200 has received a plurality of data read commands, the memory controller 200 holds these commands in, for example, a first in first out (FIFO) buffer. Then, the memory controller 200 sequentially executes a plurality of commands stored in the FIFO buffer, keeping commands, other than a command being executed, in standby states until completion of the processing of the command being executed.

Figure 3A:
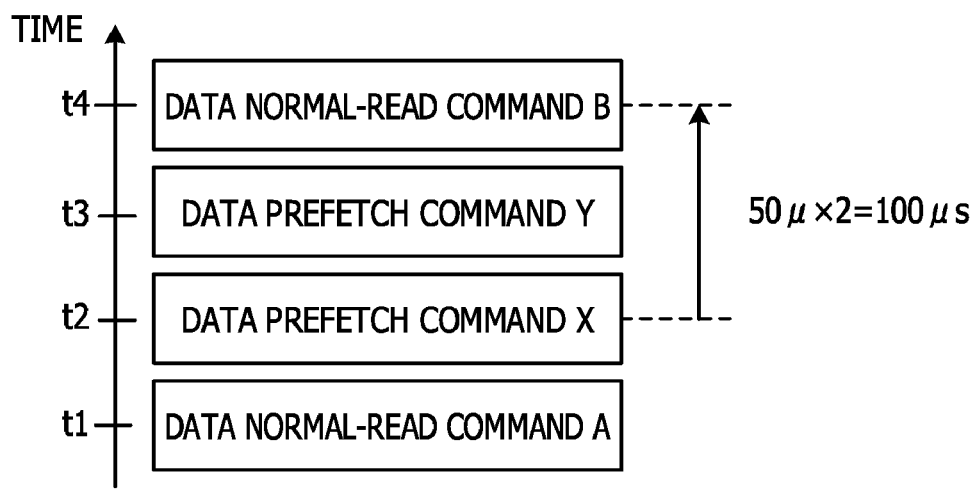
FIGS. 3A and 3B are diagrams illustrating problems solved in the first embodiment.
Figure 3B:
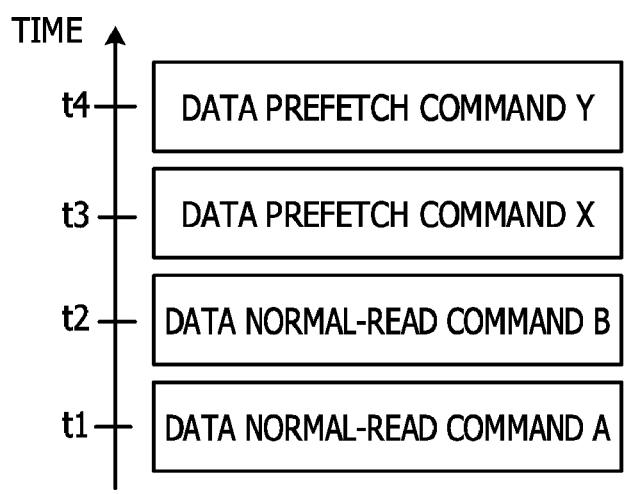

FIGS. 3A and 3B are diagrams for explaining problems solved in the first embodiment. For example, it is assumed that the information processing apparatus 10 issues a data normal-read command A for a particular address of the flash memory 250. It is assumed that, in association with the data normal-read command A, a data prefetch command X and a data prefetch command Y are issued. The data normal-read command A, the data prefetch command X, and the data prefetch command Y are stored in the FIFO buffer by the memory controller 200. Here, it is assumed that the CPU 100 further issues a data normal-read command B. The data normal-read command B is stored subsequent to the data prefetch command X and the data prefetch command Y in the FIFO buffer and enters a standby state.

The data prefetch command is a data read command speculatively issued for data that is not data decided to be used for data processing performed by the CPU 100 but is determined to have a possibility that the data will be used by the CPU 100. Therefore, there are some cases where, even when data is read from the flash memory 250 and is stored in the DRAM 160, the data is in reality not used by the CPU 100. FIG. 3A illustrates a situation in which, because a data prefetch command speculatively issued is input to the FIFO buffer, the data normal-read command B for reading data actually to be used by the CPU 100 is kept waiting for execution. In the example illustrated in FIG. 3A, assuming that, for example, the time taken is 50 µs to read data of one page of the flash memory 250, the data normal-read command B delays in execution for a time of 100 µs compared to the case where neither the data prefetch command X nor the data prefetch command Y is present in the FIFO buffer. The present embodiment is intended to reduce the delay in the execution of a data normal-read command caused by the execution of a data prefetch command.

In the present embodiment, when a data normal-read command is issued after a data prefetch command is issued, the data normal-read command is given priority in execution over the data prefetch command if the data prefetch command is in a standby state for execution in the FIFO buffer. FIG. 3B illustrates a situation in which the data normal-read command B is given priority in execution over the data prefetch command X and the data prefetch command Y. In the example illustrated in FIG. 3B, the data normal-read command B is executed at a timing earlier than in the example depicted in FIG. 3A.

Figure 4:
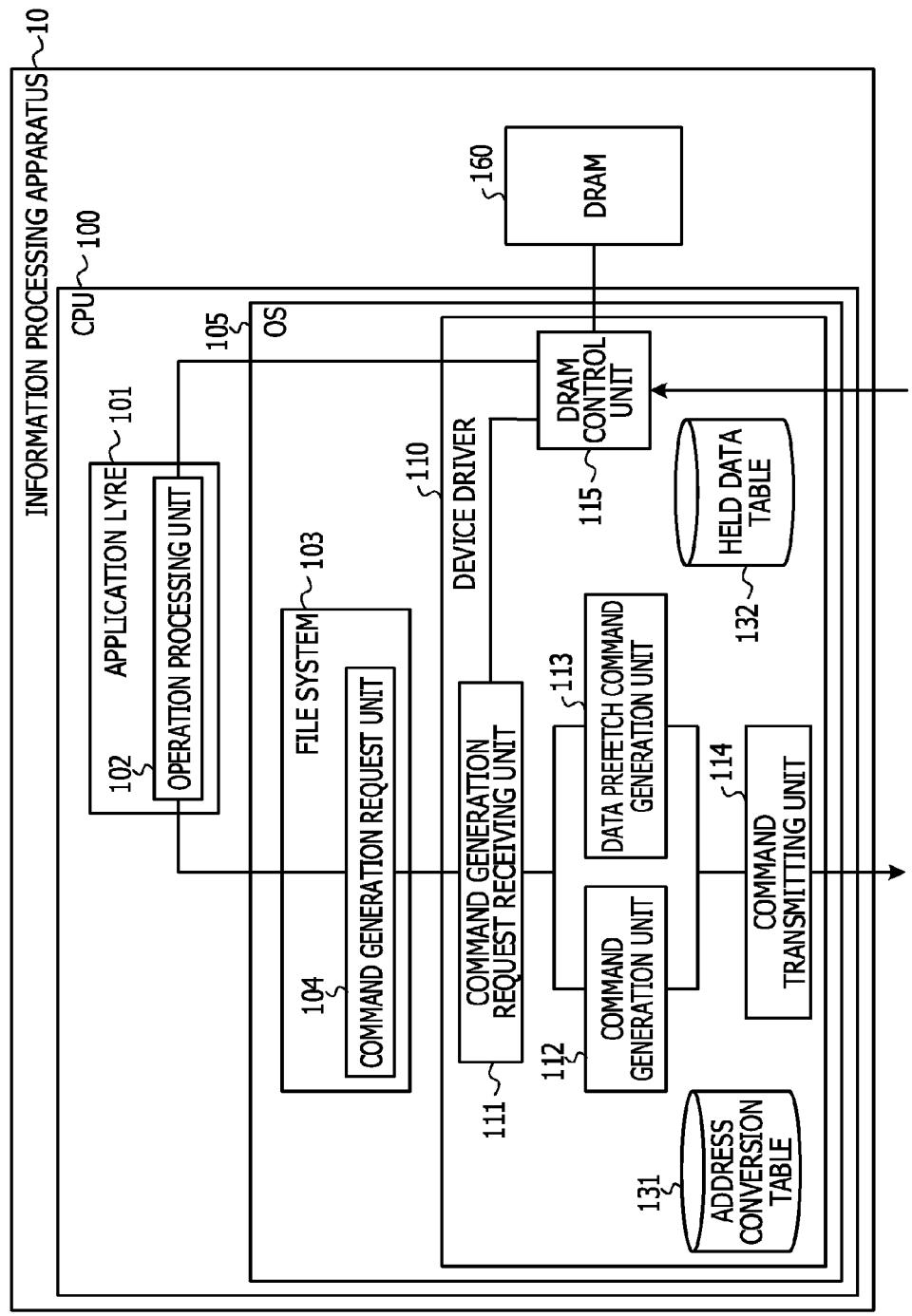
FIG. 4 illustrates functional blocks of a CPU in the first embodiment.

FIG. 4 illustrates functional blocks of the CPU 100 in the first embodiment. The CPU 100 functions as an operation processing unit 102, a command generation request unit 104, a command generation request receiving unit 111, a command generation unit 112, a data prefetch command generation unit 113, a command transmitting unit 114, and a DRAM control unit 115 by, for example, executing a computer program loaded from the ROM 150 to the DRAM 160. In FIG. 4, the operation processing unit 102 is implemented by, for example, an application layer 101. The command generation request unit 104 is implemented by, for example, a file system 103 of an operating system (OS) 105. The command generation request receiving unit 111, the command generation unit 112, the data prefetch command generation unit 113, the command transmitting unit 114, and the DRAM control unit 115 are implemented by, for example, a device driver 110. Additionally, the CPU 100 holds an address conversion table 131 and a held data table 132.

The operation processing unit 102 executes an operation based on data held in the DRAM 160. The command generation request unit 104 requests the command generation request receiving unit 111 to generate a data read command in order to read, from the storage 20, data used for execution of an operation of the operation processing unit 102. Upon receiving the request for generating a data read command from the command generation request unit 104, the command generation request receiving unit 111 instructs the command generation unit 112 and the data prefetch command generation unit 113 to generate a data normal-read command and a data prefetch command. The command generation unit 112 issues a data normal-read command for reading data for which the request has been made by the command generation request unit 104. In contrast, the data prefetch command generation unit 113 generates a data prefetch command for reading data predicted to be used by the operation processing unit 102, the data being different from the data for which the request has been made by the command generation request unit 104. Various algorithms are applicable to how to predict data that will be used. A method in which, based on, for example, the way called "Look Ahead", the address next to an address specified by a data normal-read command, for example, in NAND flash memory, the page next to a page specified by the data normal-read command is addressed is cited as an example.

Note that when the command generation unit 112 and the data prefetch command generation unit 113 issue a data normal-read command and a data prefetch command, respectively, an address managed by the operation processing unit 102 (hereinafter called a "logical address") is converted to an address managed by the storage 20 (hereinafter called a "flash memory address"). The address conversion table 131 holds the correspondence relationship between logical addresses and flash memory addresses. Each of the command generation unit 112 and the data prefetch command generation unit 113, when issuing a command, refers to the address conversion table 131 and thus causes the address of the flash memory 250, for example, information identifying the channel, block, and page to be included in the command. The commands generated by the command generation unit 112 and the data prefetch command generation unit 113 are transmitted through the command transmitting unit 114 to the storage 20.

Figure 5:
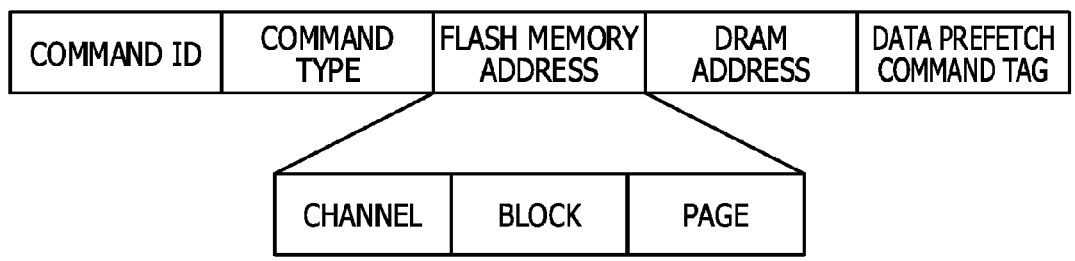
FIG. 5 depicts an example of a data configuration of a command in the first embodiment.

Prior to describing the other functional blocks illustrated in FIG. 4, description will be given with reference to FIG. 5 and FIGS. 6A and 6B. FIG. 5 depicts an example of the data configuration of each of commands issued on the command generation unit 112 and the data prefetch command generation unit 113. The command contains areas in which "command ID", "command type", "flash memory address", "DRAM address" and "data prefetch command tag" are stored, respectively. "Command ID" is an identifier for identifying each command from another, and each command is given an individual identifier. "Command type" is information indicating the type of a command. As the type of a command for the flash memory 250, for example, a data read command, a data write command, a data erasing command, and so on are listed. For a data normal-read command and a data prefetch command, in the area of "command type" of a command, information indicating that this command is a command that makes a request for data reading is registered. For a data read command, in the area of "flash memory address" of the command, information that identifies the address of the flash memory 250 at which data to be read is stored is registered. For example, channel information for identifying any channel among a plurality of channels, block information for identifying any block among a plurality of blocks included in the channel concerned, and page information for identifying any page among a plurality of pages included in the block concerned are included in the area of "flash memory address" of the command. Additionally, when the command is a data read command, an address for identifying what address of the DRAM 160 the data read from the flash memory 250 is stored at (hereinafter called a "DRAM address") is registered in the area of "DRAM address" of the command. Additionally, a tag for identifying whether the command is a data prefetch command or another command is registered in the area of "data prefetch command tag" of the command. Instead of causing a data prefetch command tag to be included in a command, a command ID may be set so as to make it clear whether or not the command is a data prefetch command.

FIGS. 6A and 6B depict examples of content of the held data table 132. In the held data table 132, information on "command ID", "logical address", "DRAM address", and "completion flag" may be stored. When the command generation unit 112 and the data prefetch command generation unit 113 generate a data normal-read command and a data prefetch command, respectively, they each write the command ID of the generated command, the logical address of data to be read (hereinafter called a "read target address"), and a DRAM address, which indicates the holding area of the read data, to the held data table 132. FIG. 6A exemplifies the content of the held data table 132 in such a manner that, when a data read command is generated, the related information is registered. It is assumed that, for example, the command generation request unit 104 performs a request for generating a data read command for a logical address "a", the command generation unit 112 generates a data normal-read command (the command ID being "A") for the logical address "a", and the data prefetch command generation unit 113 generates a data prefetch command (the command ID being "B") for a logical address "b". In this case, as depicted in FIG. 6A, a command ID, a logical address, and a DRAM address are registered for each of the generated commands in the held data table 132. Note that the meaning of "completion flag" depicted in FIGS. 6A and 6B, and so on will be described below.

Figure 7:
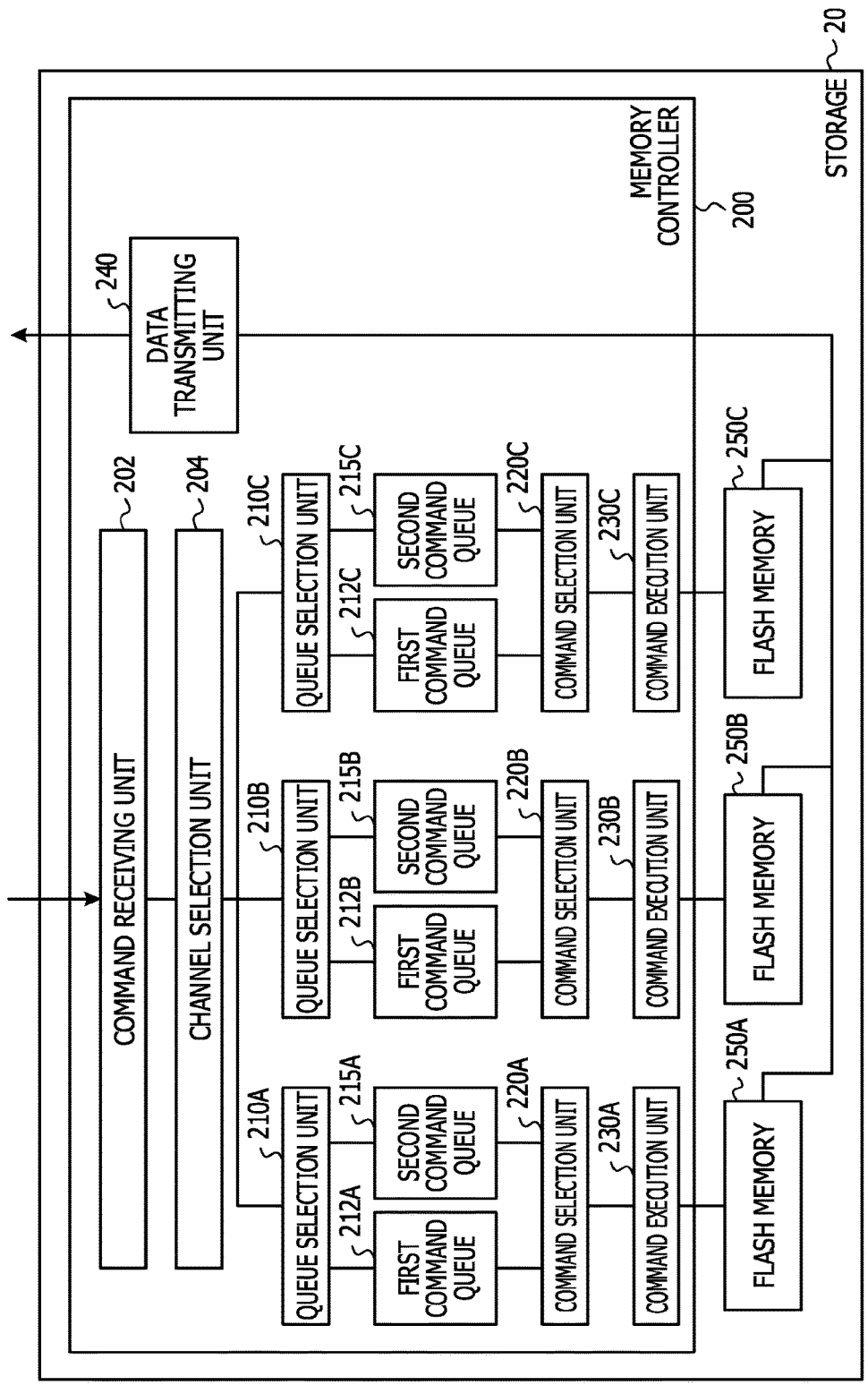
FIG. 7 illustrates functional blocks of a storage in the first embodiment.

FIG. 7 illustrates functional blocks of the storage 20 in the first embodiment. The memory controller 200 of the storage 20 functions as a command receiving unit 202, a channel selection unit 204, queue selection units 210A, 210B, and 210C (each denoted simply as a "queue selection unit 210" when there is no intention to specify any of the three queues), first command queues 212A, 212B, and 212C (each denoted simply as a "first command queue 212" when there is no intention to specify any of the three first command queues), second command queues 215A, 215B, and 215C (each denoted simply as a "second command queue 215" when there is no intention to specify any of the three second command queues), command selection units 220A, 220B, and 220C (each denoted simply as a "command selection unit 220" when there is no intention to specify any of the three command selection units), command execution units 230A, 230B, and 230C (each denoted simply as a "command execution unit 230" when there is no intention to specify any of the three command execution units), and a data transmitting unit 240. When the memory controller 200 is mounted using an FPGA, a plurality of reconfigurable gates (gate arrays) provided within the FPGA are in a desirable coupling state, thereby implementing functional blocks described above. Additionally, when the memory controller 200 is mounted using a processor such as a CPU, the functional blocks described above are implemented by the processor executing a computer program.

The command receiving unit 202 receives a command transmitted from the command transmitting unit 114 illustrated in FIG. 4. The channel selection unit 204 selects a channel that supports the command received by the command receiving unit 202, based on channel information contained in the command. In each channel, the queue selection unit 210, the first command queue 212, the second command queue 215, the command selection unit 220, and the command execution unit 230 are provided. The command for which a channel is selected by the queue selection unit 204 is input to the queue selection unit 210. The queue selection unit 210 determines, based on the presence or absence of the data prefetch command tag of this command, whether or not the command is a data prefetch command. If the command is a data prefetch command, the queue selection unit 210 inputs the command to the second command queue 215. Alternatively, if the command is a command other than the data prefetch command, for example, a data normal-read command, the command is input to the first command queue 212. The first command queue 212 and the second command queue 215 are each implemented by, for example, an FIFO buffer. In such a manner, in the present embodiment, the second command queue 215 is provided separately from the first command queue 212 that holds a command such as a data normal-read command, and a data prefetch command is selectively input to the second command queue 215.

Next, the command selection unit 220 selectively fetches commands stored in the first command queue 212 and the second command queue 215 and delivers the commands to the command execution unit 230. When a command is stored in the first command queue 212, the command selection unit 220 gives priority in selective fetching to the command stored in the first command queue 212 even if a data prefetch command is stored in the second command queue 215. The command selected by the command selection unit 220 is executed by the command execution unit 230. The command execution unit 230 executes a command based on information indicating the command type registered for the command. When the command type of the command is data reading, the command execution unit 230 performs reading of data from the flash memory 250.

If all the commands stored in the first command queue 212 have been processed such that the first command queue 212 has entered an empty state, the command selection unit 220 checks whether or not data prefetch commands are stored in the second command queue 215. If a data prefetch command is stored in the second command queue 215, the command selection unit 220 fetches this data prefetch command from the second command queue 215 and delivers the fetched command to the command execution unit 230. The data prefetch command is then executed by the command execution unit 230, and data is read from the flash memory 250. In such a manner, a data normal-read command is given priority in execution over a data prefetch command, and thus the delay in the execution of the data normal read command is reduced.

Data read from the flash memory 250 is transmitted through the data transmitting unit 240 to the information processing apparatus 10. Data transmitted from the data transmitting unit 240 is transmitted together with information on a DRAM address contained in a command issued from the information processing apparatus 10. The data transmitting unit 240 also transmits a command execution completion notification to the information processing apparatus 10.

Here, returning to the description of FIG. 4, the DRAM control unit 115 receives data transmitted from the data transmitting unit 240 of the storage 20. The DRAM control unit 115 then writes the received data at a given address of the DRAM 160. Additionally, based on a command execution completion notification transmitted from the data transmitting unit 240, the command generation unit 112 or the data prefetch command generation unit 113 registers a completion flag indicating that data reading processing for the corresponding command is complete, in the held data table 132. FIG. 6B depicts the content of the held data table 132 in a manner in which completion flags are registered. It is recorded on the held data table 132 that, regarding a command with a command ID of "A" and a logical address of "a", data read from the flash memory 250 is written to an area of "x".

Next, processing in the information processing apparatus 10 when a request for generating a data read command specifying the logical address "a" is made by the command generation request unit 104 will be described.

The command generation request receiving unit 111 receives a request for generating a data read command for the logical address "a". The command generation request receiving unit 111 refers to the held data table 132 and determines whether or not data corresponding to the logical address "a" is stored in the DRAM 160. In the example depicted in FIG. 6B, data corresponding to the logical address "a" is already stored in the DRAM 160, and therefore the command generation request receiving unit 111 instructs the DRAM control unit 115 to read data stored in the area of the DRAM address "x". The DRAM control unit 115 accesses the DRAM 160, reads data held in the area of the DRAM address "x", and delivers the data to the operation processing unit 102. Thus, when the operation processing unit 102 uses data at the logical address "a", the time taken to read data is reduced.

Figure 8:
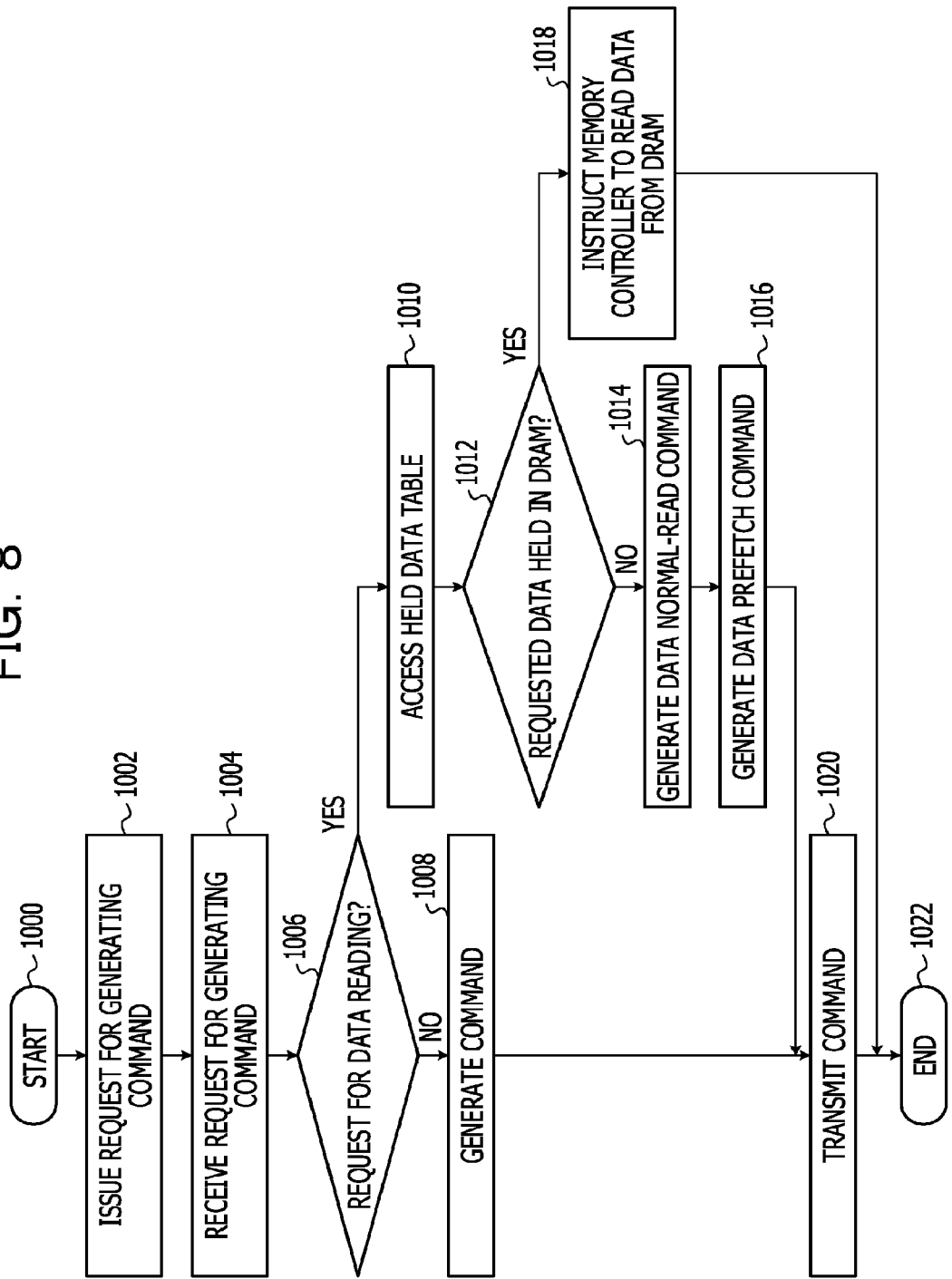
FIG. 8 illustrates a flowchart of a process executed by the CPU in the first embodiment.

FIG. 8 illustrates a flowchart of operations mainly related to generation of commands among operations performed by the CPU 100. The operation flow illustrated in FIG. 8 begins from operation 1000, and, in operation 1002, the command generation request unit 104 issues a command generation request. In operation 1004, the command generation request receiving unit 111 receives a command generation request. In operation 1006, the command generation request receiving unit 111 determines whether or not the received command generation request is a command that make a request for data reading. In operation 1006, if it is determined that the command generation request is not a request that makes a request for data reading, the operation flow proceeds to operation 1008; however, if it is determined that the command generation request is a request that makes a request for data reading, the operation flow proceeds to operation 1010. In operation 1008, in accordance with the request content of the command generation request, the command generation unit 112 generates a command, for example, a data write command or a data erasing command. If the operation flow proceeds from operation 1006 to operation 1010, in operation 1010, the command generation request receiving unit 111 accesses the held data table 132. Further, in operation 1012, it is determined whether or not data requested by the command generation request is held in the DRAM 160. In operation 1012, if it is determined that the requested data is held in the DRAM 160, the operation flow proceeds to operation 1018; however, if it is determined that the requested data is not held in the DRAM 160, the operation flow proceeds to operation 1014. In operation 1018, the command generation request receiving unit 111 instructs the DRAM control unit 115 to read the corresponding data from the DRAM 160. In this case, the operation of generating a command is not performed, and the operation flow ends in operation 1022. On the other hand, if the operation flow proceeds from operation 1012 to operation 1014, the command generation unit 112 generates a data normal-read command in operation 1014. Additionally, in operation 1016, the data prefetch command generation unit 113 generates a data prefetch command. Further, in operation 1020, the command transmitting unit 114 transmits the command generated in operation 1008 or the data normal-read command and the data prefetch command generated in operation 1014 and operation 1016, and the operation flow ends in operation 1022.

Figure 9:
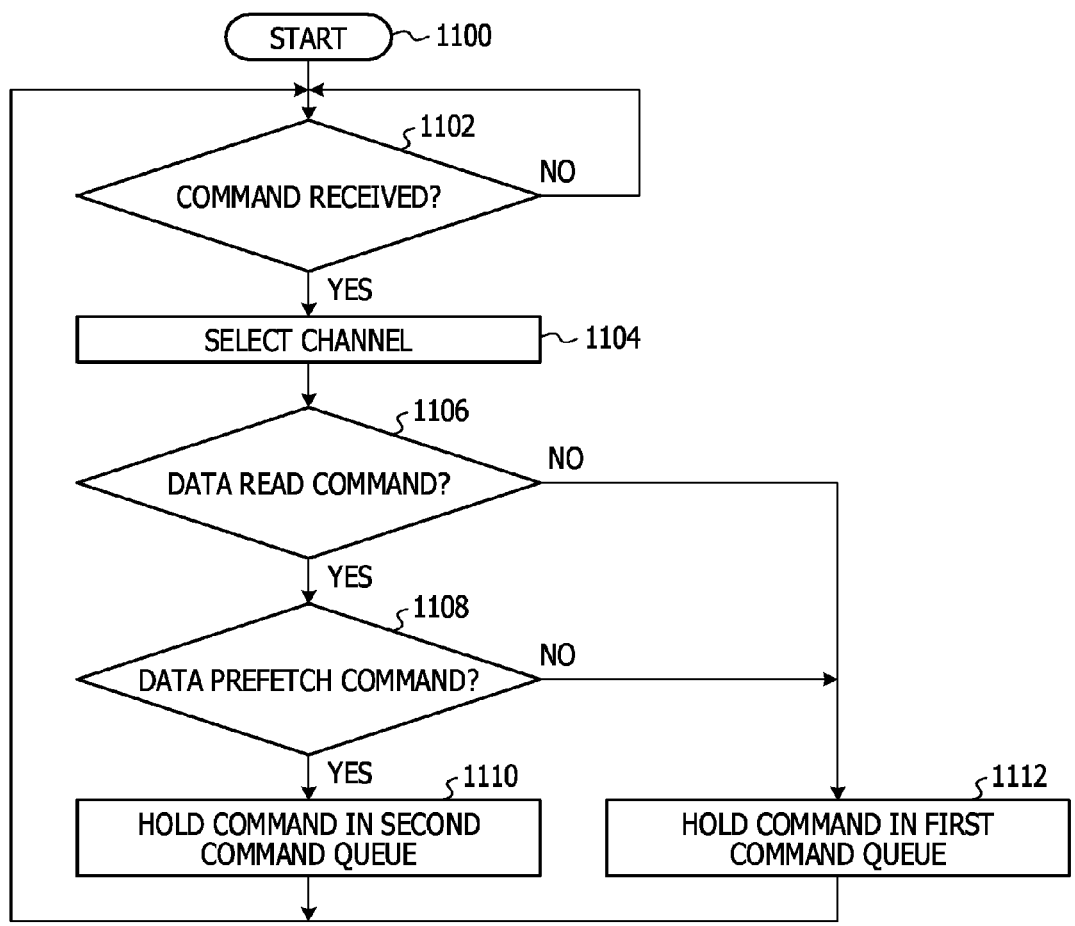
FIG. 9 illustrates a flowchart of a process executed by a memory controller in the first embodiment.

FIG. 9 illustrates a flowchart of operations mainly related to input of commands to the first command queue 212 and the second command queue 215 among operations performed by the memory controller 200. The operation flow in FIG. 9 begins from operation 1100, and, in operation 1102, the command receiving unit 202 determines whether or not a command transmitted from the command transmitting unit 114 is received. In operation 1102, if it is determined that the command is received, the operation flow proceeds to operation 1104; however, if it is not determined that the command is received, the command receiving unit 202 repeatedly performs operation 1102. In operation 1104, the channel selection unit 204 selects a channel based on channel information contained in the received command, and assigns the command to the queue selection unit 210 corresponding to the selected channel. In operation 1106, the queue selection unit 210 determines, based on command type information contained in the command, whether or not the command concerned is a data read command. In operation 1106, if it is determined that the command concerned is a data read command, the operation flow proceeds to operation 1108; however, if it is determined that the command concerned is not a data read command, the operation flow proceeds to operation 1112. If the operation flow proceeds to operation 1112, in operation 1112, the queue selection unit 210 inputs the command to the first command queue 212. On the other hand, if the operation flow proceeds to operation 1108, in operation 1108, the queue selection unit 210 determines, based on the data prefetch command tag of the command, whether or not the command concerned is a data prefetch command. In operation 1108, if it is determined that the command concerned is not a data prefetch command, the operation flow proceeds to operation 1112; however, if it is determined that the command concerned is a data prefetch command, the operation flow proceeds to operation 1110. In operation 1110, the queue selection unit 210 inputs the command to the second command queue 215. After the command is held in the first command queue 212 or the second command queue 215, the operation flow returns to operation 1102.

Figure 10:
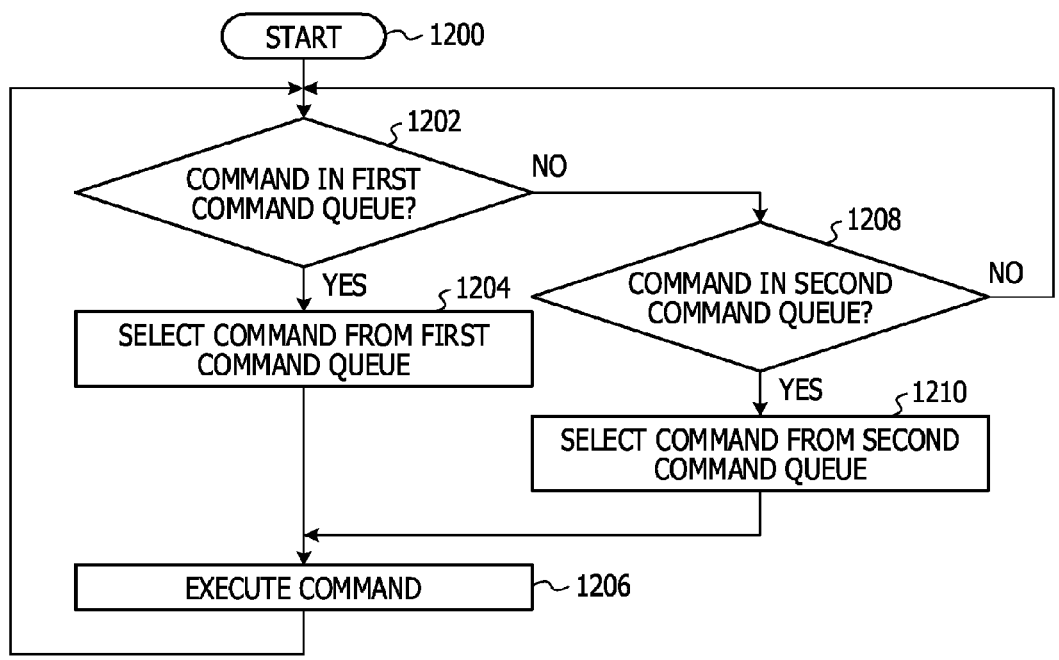
FIG. 10 illustrates a flowchart of a process executed by the memory controller in the first embodiment.

FIG. 10 illustrates a flowchart of operations mainly related to selection and execution of commands stored in the first command queue 212 and the second command queue 215 among operations performed by the memory controller 200. The operation flow in FIG. 10 begins from operation 1200, and, in operation 1202, the command selection unit 220 determines whether or not a command is stored in the first command queue 212. In operation 1202, if it is determined that a command is stored in the first command queue 212, the operation flow proceeds to operation 1204; however, if it is determined that no command is stored in the first command queue 212, the operation flow proceeds to operation 1208. In operation 1204, the command selection unit 220 selects and fetches, out of commands stored in the first command queue 212, a command positioned at the head of the queue. Further, in operation 1206, the command execution unit 230 executes the command selected in operation

1204. On the other hand, if the operation flow proceeds from operation 1202 to operation 1208, in operation 1208, the command selection unit 220 determines whether or not a data prefetch command is stored in the second command queue 215. In operation 1208, if it is determined that a data prefetch command is stored in the second command queue 215, the operation flow proceeds to operation 1210; however, if it is determined that no data prefetch command is stored in the second command queue 215, the operation flow returns to operation 1202. In operation 1210, the command selection unit 220 extracts, out of commands stored in the second command queue 215, a data prefetch command at the head of the queue. Further, in operation 1206, the command execution unit 230 executes the data prefetch command. After operation 1206, the operation flow returns to operation 1202.

Figure 11:
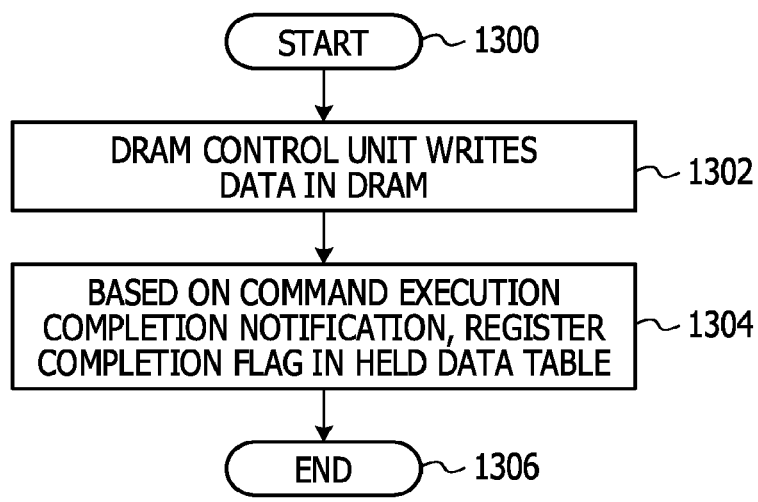
FIG. 11 illustrates a flowchart of a process executed by the CPU in the first embodiment.

FIG. 11 illustrates a flowchart of operations mainly related to writing of data to the DRAM 160 among operations performed by the CPU 100. The operation flow in FIG. 11 begins from operation 1300, and, in operation 1302, the DRAM control unit 115 writes data received from the storage 20 to the DRAM 160. In operation 1304, based on a command execution completion notification received from the storage 20, the command generation unit 112 or the data prefetch command generation unit 113 registers a completion flag in the held data table 132, and the operation flow ends in operation 1306.

In such a way, according to the first embodiment, during issuance of a command, the information processing apparatus 10 causes a data prefetch command tag, which indicates whether or not this command is a data prefetch command, to be contained in the command. Having received the command, the storage 20 determines whether or not the command is a data prefetch command. The storage 20 classifies the received commands into data prefetch commands and the other commands, and inputs the commands and the other commands to respectively provided command queues. When commands are stored in the first command queue 212, which is a queue for commands other than data prefetch commands, the commands stored in the first command queue 212 are given priority in execution over commands stored in the second command queue 215, which is a queue for data prefetch commands. Thus, the delay in the execution of a data normal-read command caused by the execution of a data prefetch command is reduced.

Second Embodiment

In a second embodiment, it is monitored whether or not data read from the flash memory 250 by a data prefetch command is then actually used for an operation performed by the operation processing unit 102. Further, for the data that is read by the data prefetch command (hereinafter called "prefetched data") and is actually not used for an operation, issuance of a data prefetch command will not be performed thereafter. Thus, unnecessary issuance of data prefetch commands is reduced.

Figure 12:
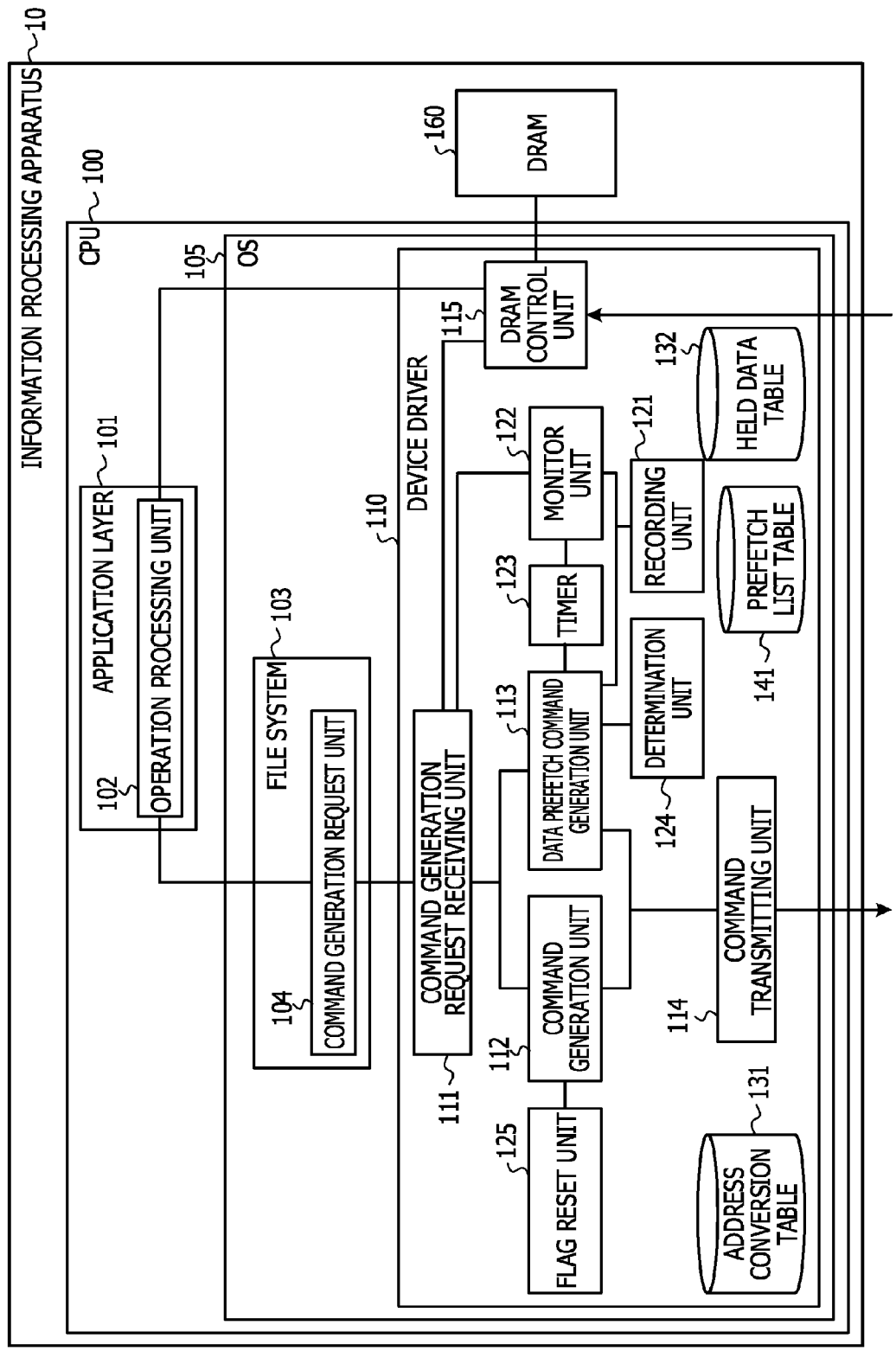
FIG. 12 illustrates a functional block diagram of a CPU in a second embodiment.

FIG. 12 illustrates functional blocks of the CPU 100 in the second embodiment. Functional blocks having the same functions as the functional blocks illustrated in the first embodiment (FIG. 4) are denoted by the same reference numerals as the reference numerals denoted in FIG. 4, and the description is omitted. The CPU 100 functions as, in addition to the functional blocks illustrated in FIG. 4, a recording unit 121, a monitor unit 122, a timer 123, a determination unit 124, and a flag reset unit 125. The CPU 100 also holds a prefetch list table 141. Note that, in the second embodiment, the same functional blocks as the functional blocks illustrated in the first embodiment (FIG. 7) may be applied to the storage 20.

FIG. 13A and FIG. 13B depict examples of content of the prefetch list table 141. In the prefetch list table 141, "logical address", "write time", and "determination flag" may be registered. When the data prefetch command generation unit 113 generates a data prefetch command, the recording unit 121 records the read target address of this command in the column of "logical address" of the prefetch list table 141. The recording unit 121 also acquires the receipt time of a command execution completion notification transmitted from the storage 20 for the data prefetch command concerned, from the timer 123, and records the acquired time in the column "write time" of the prefetch list table 141. In FIG. 13A, it is recorded that data prefetch commands are issued for data with the logical addresses "a", "b", and "c", respectively. It is also recorded that command execution completion notifications indicating completion of execution of these data prefetch commands are received by the data prefetch command generation unit 113 at "9:13:21.37", "9:13:21.89", and "9:13:22.15", respectively.

After a data prefetch command is issued, the monitor unit 122 monitors whether or not data read from the flash memory 250 is actually used by the operation processing unit 102. Specifically, the monitor unit 122 monitors content registered in the prefetch list table 141, a command generation request received by the command generation request receiving unit 111, and the time measured by the timer 123. Further, it is determined whether or not the logical address of data requested to be read by the command generation request is recorded in the prefetch list table 141. When the logical address concerned is recorded in the prefetch list table 141 and when a given period of time (for example, one second) has not yet passed from the write time recorded in the prefetch list table 141, the logical address concerned is deleted from the prefetch list table 141. Conversely, when, even if the given period of time has passed from the write time recorded in the prefetch list table 141, a request for generating a data read command for the logical address concerned is not made, a determination flag is registered in the prefetch list table 141. In other words, a determination flag of the prefetch list table 141 refers to the fact that, although data prefetch processing for the logical address concerned is performed, the read data is actually not used for an operation performed by the operation processing unit 102. FIG. 13B depicts a manner in which the content of the prefetch list table 141 exemplified in FIG. 13A is updated. In FIG. 13B, the situation is depicted in which, after data prefetch processing for the logical address "a" is performed, a request for generating a data read command is not made for the logical address "a" within a given period of time, and a determination flag is registered in the column of the logical address "a". In contrast, after data prefetch processing is performed for the logical address "b", a request for generating a data read command is made for the logical address "b" within the given period of time, and the logical address "b" is deleted from the prefetch list table 141. Note that, for a logical address "c", the given period of time has not yet passed after data prefetch processing has been performed, and a determination flag is not set.

In such a way, logical addresses without instances of actual use are stored as past achievements in the prefetch list table 141.

Next, the way to use the prefetch list table 141 created in the method described above will be described. The command generation request unit 104 performs a request for generating a data read command, and the command generation request receiving unit 111 receives this request. Based on the request, the data prefetch command generation unit 113 identifies a logical address at which data is to be prefetched based on a given algorithm. Here, the determination unit 124 determines whether or not the identified logical address is recorded in the prefetch list table 141. If the identified logical address is recorded in the prefetch list table 141 and a determination flag is registered for the logical address concerned, the determination unit 124 determines that creating a data prefetch command for the logical address is unnecessary. Further, the determination unit 124 instructs the data prefetch command generation unit 113 to avoid generating a data prefetch command. Thus, data that has been read by a data prefetch command in the past but actually has not been used for an operation may be inhibited from being again subjected to data prefetch processing.

Figure 14:
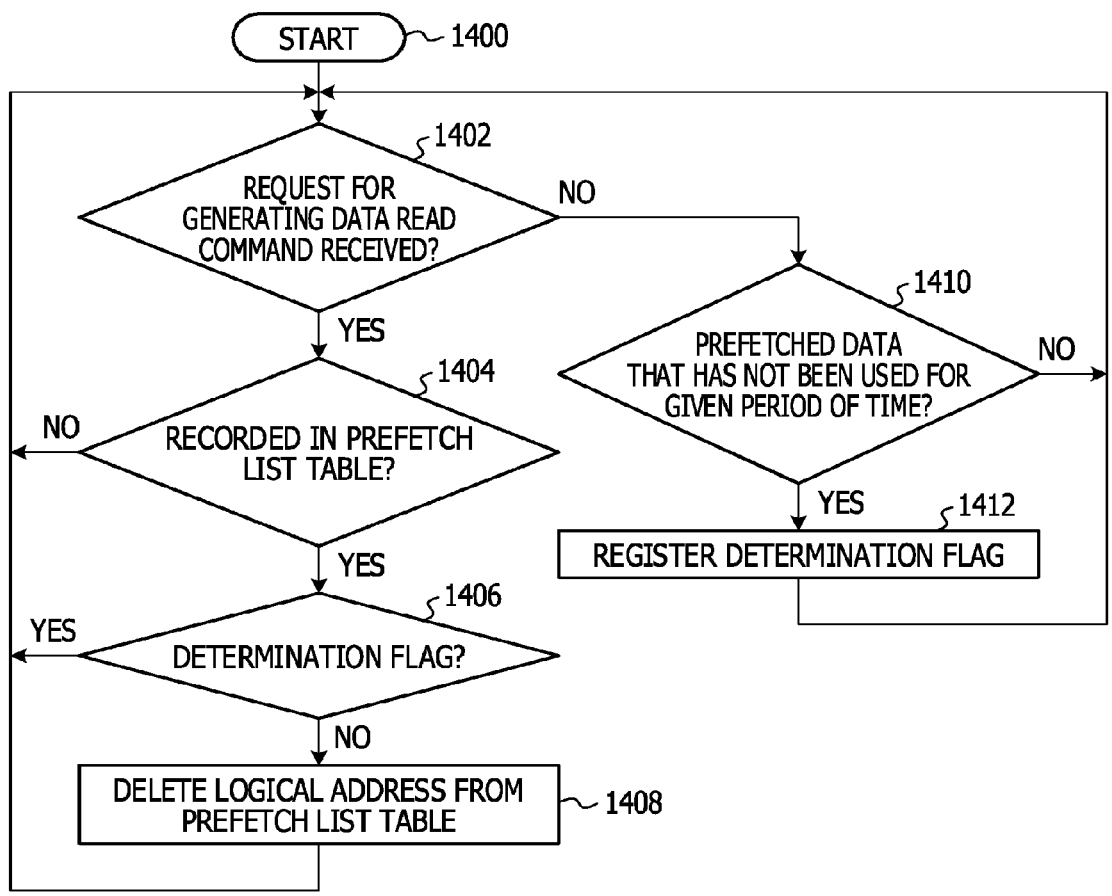
FIG. 14 illustrates a flowchart of a process executed by the CPU in the second embodiment.

FIG. 14 illustrates a flowchart of operations mainly performed by the monitor unit 122 among operations performed by the CPU 100 in the second embodiment. The operation flow in FIG. 14 begins from operation 1400, and, in operation 1402, the monitor unit 122 determines whether or not a request for generating a data read command is received by the command generation request receiving unit 111. In operation 1402, if it is determined that a request for generating a data read command is received, the operation flow proceeds to operation 1404; however, if it is determined that a request for generating a data read command is not received, the operation flow proceeds to operation 1410.

First, description will be given of the case when the operation flow proceeds to operation 1404. In operation 1404, the monitor unit 122 determines whether or not the logical address specified by the received request is recorded in the prefetch list table 141. In operation 1404, if it is determined that the specified logical address is recorded in the prefetch list table 141, the operation flow proceeds to operation 1406; however, if it is determined that the specified logical address is not recorded in the prefetch list table 141, the operation flow returns to operation 1402. In operation 1406, the monitor unit 122 determines whether or not a determination flag is registered at the logical address registered in the prefetch list table 141. If, in operation 1406, it is determined that a determination flag is not registered, the operation flow proceeds to operation 1408; however, if it is determined that a determination flag is registered, the operation flow returns to operation 1402. In operation 1408, the monitor unit 122 instructs the recording unit 121 to delete the logical address concerned from the prefetch list table 141, and the recording unit 121 deletes the logical address concerned from the prefetch list table 141.

On the other hand, if the operation flow proceeds from operation 1402 to operation 1410, in operation 1410, the monitor unit 122 determines whether or not there is prefetched data that has not been used for a certain period of time after the prefetched data has been read from the flash memory 250. Specifically, the monitor unit 122 makes the determination in operation 1410 based on the time measured by the timer 123 and the write time recorded in the prefetch list table 141. In operation 1410, if it is determined that there is no prefetched data that has not been used for the certain period of time, the operation flow returns to operation 1402; however, if it is determined that there is prefetched data that has not been used for the certain period of time, the operation flow proceeds to operation 1412. In operation 1412, the monitor unit 122 instructs the recording unit 121 to register a determination flag in the column of the prefetched data that has not been used for the certain period of time, and the recording unit 121 registers a determination flag in the prefetch list table 141. After operation 1412, the operation flow returns to operation 1402. In such a way, instances of actual use of prefetched data are stored in the prefetch list table 141 and are referred to at the time of later generation of a data prefetch command.

Figure 15:
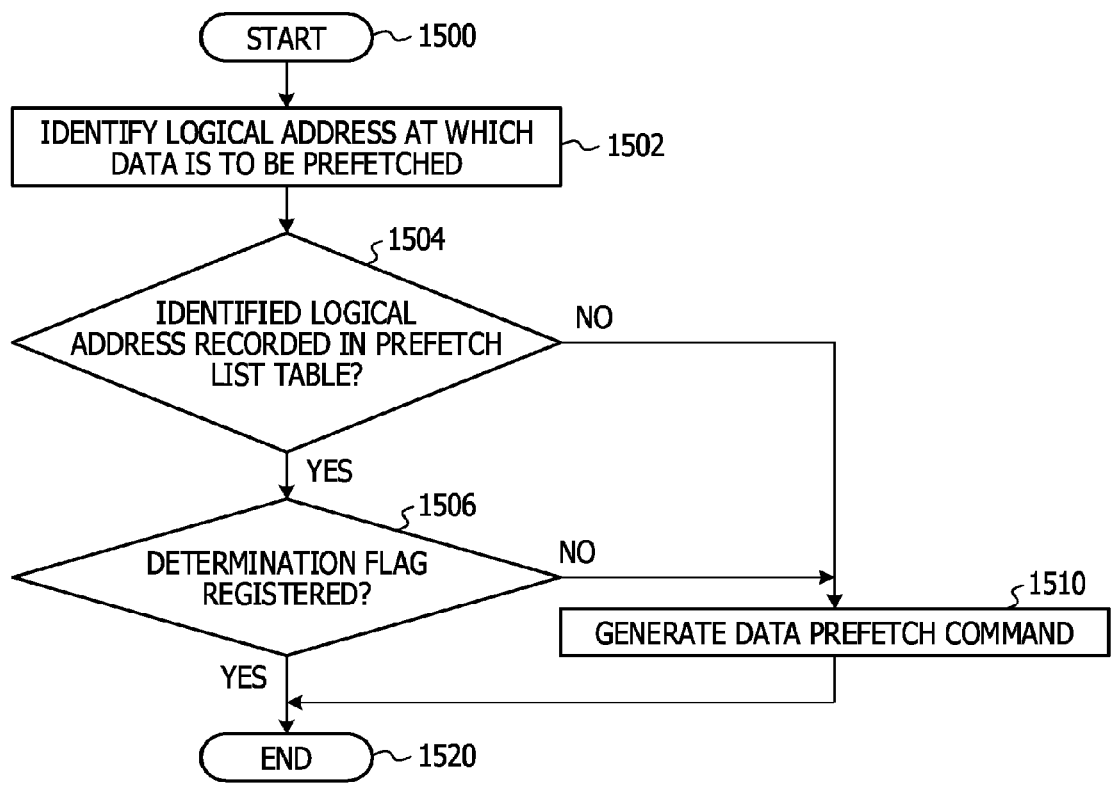
FIG. 15 illustrates a flowchart of a process executed by the CPU in the second embodiment.

FIG. 15 illustrates a flowchart of operations related to generation of a data prefetch command among operations performed by the CPU 100 in the second embodiment. The operation flow illustrated in FIG. 15 corresponds to operation 1016 illustrated in FIG. 8. The operation flow begins from operation 1500, and, in operation 1502, the data prefetch command generation unit 113 identifies a logical address at which data is to be prefetched. In operation 1504, the determination unit 124 determines whether or not the logical address identified in operation 1502 is recorded in the prefetch list table 141. If, in operation 1504, it is determined that the identified logical address is recorded in the prefetch list table 141, the operation flow proceeds to operation 1506; however, if it is determined that the identified logical address is not recorded in the prefetch list table 141, the operation flow proceeds to operation 1510. In operation 1506, the determination unit 124 determines whether or not a determination flag is registered for the identified logical address in the prefetch list table 141. If, in operation 1506, it is determined that a determination flag is registered, the operation flow ends in operation 1520. In this case, a data prefetch command is not generated. Alternatively, if, in operation 1506, it is determined that a determination flag is not registered, the operation flow proceeds to operation 1510. In operation 1510, the data prefetch command generation unit 113 generates a data prefetch command, and the operation flow ends in operation 1520.

In such a way, in the second embodiment, data read from the flash memory 250 by a data prefetch command is then monitored as to whether the data has been used by the operation processing unit 102. If data read from the flash memory 250 through data prefetch processing has not been used in an operation performed by the operation processing unit 102 within a certain period of time after the data has been read, the logical address and the determination flag of the prefetched data are recorded in association with each other in the prefetch list table 141. Thereafter, no data prefetch command is issued for the logical address. Thus, the issuance of data prefetch commands for data that is less likely to be used is reduced.

Next, the function and the processing details of the flag reset unit 125 will be described. The flag reset unit 125 has a function in which, when a data write command for the flash memory 250 is issued from the command generation unit 112, a logical address and a determination flag the data of which is rewritten by this command are deleted from the prefetch list table 141. Since, when the data write command is issued, the content of data stored in the flash memory 250 is changed, the logical address and the determination flag set for data that is stored at some flash memory address and has not yet been changed are reset.

The second embodiment has been described. Next, a modification of the second embodiment will be described. In the second embodiment, the example is disclosed in which, regarding prefetched data that has not been used within a certain period of time after data prefetch processing has been performed, a determination flag indicating disuse of the data is registered. In the modification of the second embodiment, a determination flag is registered at the point in time at which prefetched data is erased from the area of the DRAM 160 in which prefetched data is held.

In the present modification, the time at which prefetched data is written to the DRAM 160 is recorded in the held data table 132. When this prefetched data is used on the operation processing unit 102, the time information recorded in the held data table 132 is overwritten with the time at which the prefetched data is used. The DRAM control unit 115 conducts work of sequentially writing prefetched data newly read from the flash memory 250 to the DRAM 160 while sequentially erasing old prefetched data for which a long period of time has passed after the data has been written to the DRAM 160. For example, when the available space of an area assigned to prefetched data in the data holding area of the DRAM 160 is less than or equal to a threshold, data is erased in the order from data for which the period of time that has passed from the time identified by time information recorded in the held data table 132 is longest. Additionally, when prefetched data is erased from the DRAM 160, the DRAM control unit 115 updates the content of the held data table 132. That is, when prefetched data is erased from the DRAM 160, the corresponding logical address is deleted from the held data table 132.

The monitor unit 122 monitors the content of the held data table 132. It is assumed that, for example, the logical address "a" recorded in the held data table 132 is erased. In this case, the monitor unit 122 accesses the prefetch list table 141 and determines whether or not the logical address "a" is recorded in the prefetch list table 141. If the logical address "a" is recorded in the prefetch list table 141, the recording unit 121 is instructed to register a determination flag in correspondence to the logical address "a". Thus, a determination flag is registered for the logical address "a". The monitor unit 122 also detects a command generation request received by the command generation request receiving unit 111. It is assumed that, for example, the command generation request receiving unit 111 receives a request for generating a data read command that specifies the logical address "a". In this case, the monitor unit 122 determines whether or not the logical address "a" is recorded in the prefetch list table 141. If the logical address "a" is recorded in the prefetch list table 141, the monitor unit 122 further determines whether or not a determination flag is registered in correspondence to the logical address "a". If the determination flag is not registered, the monitor unit 122 instructs the recording unit 121 to erase the logical address "a" from the prefetch list table 141. Thus, the logical address "a" is erased from the prefetch list table 141.

Figure 16:
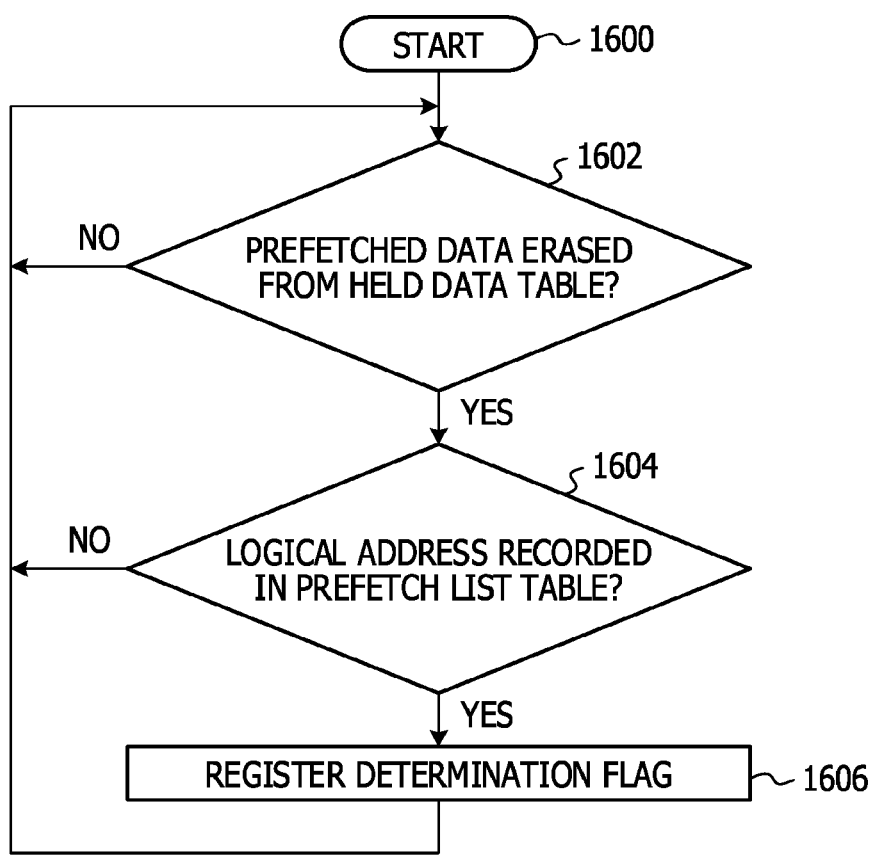
FIG. 16 illustrates a flowchart of a process executed by a CPU in a modification of the second embodiment.

FIG. 16 illustrates a flowchart of operations related to registration of a determination flag among operations performed by the CPU 100 in the modification of the second embodiment. The operation flow begins from operation 1600, and, in operation 1602, the monitor unit 122 determines whether or not there is prefetched data erased from the held data table 132. In operation 1602, if it is determined that there is prefetched data erased, the operation flow proceeds to operation 1604; however, if it is determined that there is no prefetched data erased, the monitor unit 122 repeatedly performs operation 1602. In operation 1604, the monitor unit 122 determines whether or not a logical address corresponding to the prefetched data erased from the held data table 132 is recorded in the prefetch list table 141. In operation 1604, if it is determined that the logical address corresponding to the prefetched data erased is recorded in the prefetch list table 141, the operation flow proceeds to operation 1606; however, if it is determined that the logical address corresponding to the prefetched data erased is not recorded in the prefetch list table 141, the operation flow returns to operation 1602. In operation 1606, the monitor unit 122 instructs the recording unit 121 to register a determination flag for the logical address recorded in the prefetch list table 141, and the recording unit 121 registers the determination flag. After operation 1606, the operation flow returns to operation 1602.

Figure 17:
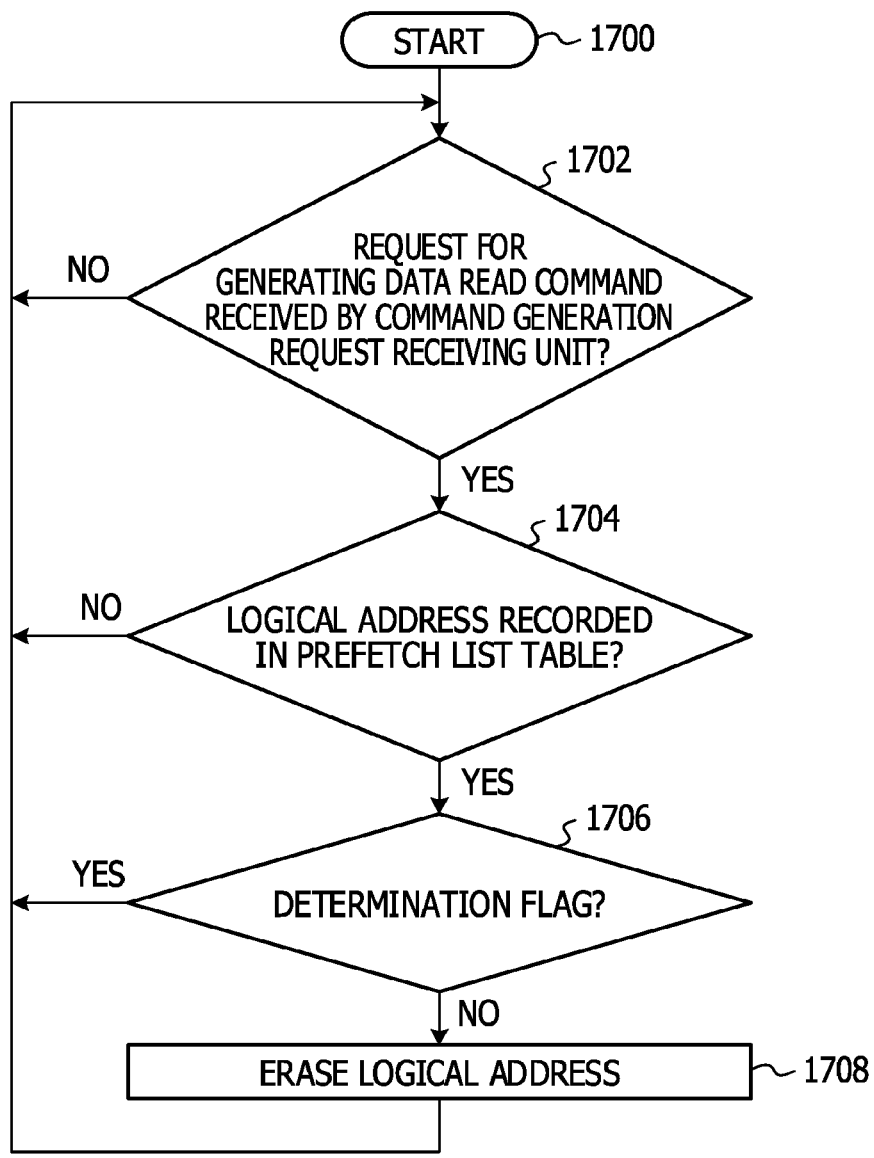
FIG. 17 illustrates a flowchart of a process executed by the CPU in the modification of the second embodiment.

FIG. 17 illustrates a flowchart of operations of erasing a logical address from the prefetch list table 141 among operations performed by the CPU 100 in the modification of the second embodiment. The operation flow begins from operation 1700, and, in operation 1702, the monitor unit 122 determines whether or not a request for generating a data read command is received by the command generation request receiving unit 111. In operation 1702, if it is determined that the request for generating a data read command is received, the operation flow proceeds to operation 1704; however, if it is determined that the request for generating a data read command is not received, the monitor unit 122 repeatedly performs operation 1702. In operation 1704, the monitor unit 122 determines whether or not a logical address specified by the command generation request is recorded in the prefetch list table 141. In operation 1704, if it is determined that the logical address specified by the command generation request is recorded, the operation flow proceeds to operation 1706; however, if it is determined that the logical address specified by the command generation request is not recorded, the operation flow returns to operation 1702. In operation 1706, the monitor unit 122 determines whether or not a determination flag is registered for the logical address specified by the command generation request. In operation 1706, if it is determined that the determination flag is not registered, the operation flow proceeds to operation 1708; however, if it is determined that the determination flag is registered, the operation flow returns to operation 1702. Further, in operation 1708, the monitor unit 122 instructs the recording unit 121 to erase the logical address recorded in the prefetch list table 141, and the recording unit 121 erases the logical address from the prefetch list table 141. After operation 1708, the operation flow returns to operation 1702.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of reading data from a first memory device, the method comprising:
    generating a first read command based on a first request which requests to generate the first read command for first data stored in a first address region of the first memory device;
    storing the first read command in a first buffer;
    generating a second read command for second data stored in a second address region different from the first address region of the first memory device, the second read command being generated by a first prefetch command for prefetching the second data, the first prefetch command including a prefetch flag indicating the prefetch command;
    storing the second read command in a second buffer;

after the generating the second read command, generating a third read command based on a second request which requests to generate the third read command for third data stored in a third address region of the first memory device;
storing the third read command in the first buffer;
executing the first read command and the third read command to read the first data and the third data, respectively, from the first memory device;
deleting the first read command and the third read command from the first buffer when the first read command and the third read command are executed, respectively;
after deleting the first read command and the third read command from the first buffer, when the first buffer is empty, executing the second read command to read the second data from the first memory device;
storing the first data, the second data, and the third data read from the first memory device in a second memory device; and
reading the second data from the second memory device when a third request which requests to generate a fourth read command for the second data stored in the first memory device is issued.

2. The method according to claim 1, wherein
the first read command, the second read command, and the third read command are generated by an information processing device coupled to the first memory device,
the first memory device is a nonvolatile memory device, and
the second memory device is a volatile memory device.

3. The method according to claim 2, wherein the first request includes information identifying the first address and does not include information identifying the second address.

4. The method according to claim 3, further comprising:
executing, by a processor of the information processing device, a calculation using the first data and the third data stored in the second memory device.

5. The method according to claim 4, further comprising:
predicting, by the processor, the second data is used for the calculation, wherein
the second read command is generated based on the predicting.

6. The method according to claim 4, wherein
the first buffer and the second buffer are provided in a memory control device located between the information processing device and the first memory device, and
the executions of the first read command, the second read command and the third read command are executed by the memory control device.

7. An information processing system comprising:
a first memory device;
a memory control device coupled to the first memory device and including a first buffer and a second buffer; and
a processor coupled to the memory control device, wherein
the processor is configured to:
  generate a first read command based on a first request which requests to generate the first read command for first data stored in a first address region of the first memory device,
  generate a second read command for second data stored in a second address region different from the first address region of the first memory device, the second read command being generated by a first prefetch command for prefetching the second data, the first prefetch command including a prefetch flag indicating prefetch command, and
  after the second read command is generated, generate a third read command based on a second request which requests to generate the third read command for third data stored in a third address region of the first memory device, and
the memory control device is configured to:
  store the first read command and the third read command in the first buffer,
  store the second read command in the second buffer,
  execute the first read command and the third read command to read the first data and the third data, respectively, from the first memory device,
  delete the first read command and the third read command from the first buffer when the first read command and the third read command are executed, respectively,
  after deleting the first read command and the third read command from the first buffer, when the first buffer is empty, execute the second read command to read the second data from the first memory device,
  store the first data, the second data, and the third data read from the first memory device in a second memory device, and
  read the second data from the second memory device when a third request which requests to generate a fourth read command for the second data stored in the first memory device is issued.

8. The information processing system according to claim 7, wherein
the first memory device is a nonvolatile memory device, and
the second memory device is a volatile memory device.

9. The information processing system according to claim 8, wherein the first request includes information identifying the first address and does not include information identifying the second address.

10. The information processing system according to claim 9, wherein the processor is further configured to:
execute a calculation using the first data and the third data stored in the second memory device.

11. The information processing system according to claim 10, wherein
the processor is further configured to predict that the second data is used for the calculation, and
the second read command is generated based on the predicting.

12. The method according to claim 1, further comprising:
when the third request which requests to generate the fourth read command for reading the second data is not issued within a certain time period after the second data is stored in the second memory device, and when a fourth request which requests to generate a fifth read command for the first data is issued after the certain time period, not generating, based on the fourth request, the fourth read command for reading the second data stored in the first memory.

13. The method according to claim 12, further comprising:
when the third request is issued within the certain time period, and when the fourth request is issued after the certain time period, generating the fourth read command for reading the second data.

14. The method according to claim 12, wherein
when the third request is issued within the certain time period, reading the second data from the second memory device.

15. The method according to claim 12, wherein
the first memory is nonvolatile memory device, and
the second memory is volatile memory device.

\* \* \* \* \*